(12) United States Patent  
Zucker et al.

(10) Patent No.: US 7,227,280 B2  
(45) Date of Patent: Jun. 5, 2007

(54) ISOLATED CONTROL APPARATUS INCORPORATING LIGHT CONTROLLED POWER SEMICONDUCTORS

(75) Inventors: Oved Zucker, Arlington, VA (US); Vladimir P. Leonov, Falls Church, VA (US); Simon Y. London, Rockville, MD (US)

(73) Assignee: Bae Systems Information and Electronic Systems Integration Inc., Nashua, NH (US)

( * ) Notice: Subject to any disclaimer, the term of this patent is extended or adjusted under 35 U.S.C. 154(b) by 282 days.

(21) Appl. No.: 10/902,796

(22) Filed: Aug. 2, 2004

(65) Prior Publication Data

US 2005/0145699 A1    Jul. 7, 2005

Related U.S. Application Data

(60) Provisional application No. 60/491,673, filed on Aug. 1, 2003.

(51) Int. Cl.  
*H01L 31/08* (2006.01)  
*H01G 9/20* (2006.01)

(52) U.S. Cl. ............................ 307/117
(58) Field of Classification Search ........... 307/117; 250/215  
See application file for complete search history.

(56) References Cited

U.S. PATENT DOCUMENTS 4,126,819 A    11/1978    Stobbe et al.
4,485,434 A    11/1984    Beeston et al.
4,564,770 A     1/1986    Sherman et al.
5,045,680 A *   9/1991    Fan et al. ............. 250/214 LS
5,281,805 A *   1/1994    Sauer .................... 250/214 R
5,323,305 A     6/1994    Ikeda et al.
6,218,682 B1    4/2001    Zucker et al.

OTHER PUBLICATIONS

IBM Technical Disclosure Bulleting; Optical Switch, Nov. 1986, US Volume No. 29; 3 pages.
IBM Technology Disclosure Bulletin; Laser Diode Control Circuits, Jun. 1, 1987, US Volume No. 30; 3 pages.

* cited by examiner

*Primary Examiner*—Robert L. Deberadinis  
*Assistant Examiner*—Adi Amrany  
(74) *Attorney, Agent, or Firm*—Bingham McCutchen LLP

(57) ABSTRACT

A system for direct optical control of electronic power semiconductors includes an optical triggering circuit at a first location, wherein said optical triggering circuit generates an optical trigger signal, a power circuit located at a second location remote from the first location, wherein said power circuit includes a photoconductor that is responsive to the optical trigger signal generated by the optical triggering circuit, and an optical cable coupling the optical triggering circuit to the power circuit. In operation, the power circuit is directly driven by the transmission of the optical trigger signal from the optical triggering circuit to the power circuit via the optical cable. Inductive elements or transformers may be applied to facilitate triggering performance.

11 Claims, 11 Drawing Sheets

| LASER ENERGY AND POWER REQUIREMENTS | PHOTOCONDUCTOR STRUCTURE | | | |
|---|---|---|---|---|
| | DIODE | | THYRISTOR | |
| | ON | OFF | ON | OFF |
| LASER PULSE ENERGY (µj) | 1.37 | 1.05 | .0145 | .009 |
| LASER POWER — PEAK (w) | 27.4 | 3.3 | 2.91 | .003 |
| LASER POWER — AVERAGE (mw) @100kHz | 1.17 | 100 | 1.45 | .091 |

$n\,d = E_{ox} \cdot (E_{ox})/e = 10^{10} \cdot 10^{-4}$

@$E = 1.5\text{MV/cm}$, epsilon = 2

$= j\,d = 0.3\text{A/cm}$ @ $V_d = 10^6$ cm/s

ISOLATED CONTROL APPARATUS INCORPORATING LIGHT CONTROLLED POWER SEMICONDUCTORS

CROSS REFERENCES TO RELATED APPLICATIONS

This application claims the benefit of priority from U.S. patent application Ser. No. 09/484,376, filed on Jan. 14, 2000 and claims the benefit of priority from U.S. provisional patent application No. 60/491,673 filed on Aug. 1, 2003.

FIELD OF THE INVENTION

The invention relates in general to control of power semiconductor devices. More specifically, the invention relates to an apparatus for controlling power semiconductor devices wherein optical isolation is provided between a benign environment containing control processing circuitry and a harsh environment containing the power semiconductor devices and a driven load.

BACKGROUND OF THE INVENTION

It is desirable in many control applications to remove sensitive electronics from a harsh environment in which a power semiconductor and a driven load are located. Power semiconductors, for example, are used to control heavy machinery motors, robotics, flight actuators and other devices that are usually located in harsh environments having high temperatures, radiation and vibration. While existing power semiconductors (Thyristors, GTO'S, IGBT'S, MCT's etc.) can tolerate temperatures in excess of 100° C., information processing electronics, such as microprocessors, require a more benign temperature environment in order to properly operate. It is therefore necessary to provide isolation between the harsh environment of the power semiconductors and the benign environment required by the information processing electronics.

One particular application in requiring isolation is in the field of flight controls. Efforts have been made to replace conventional hydraulic control systems with electronic control systems such that electronic commands are sent to actuators through wire connections. These so called "Fly-By-Wire" (FBW) systems provide many advantages over conventional hydraulic control systems, including substantial reductions in vehicle weight and complexity, but can still be susceptible to problems associated with electro magnetic interference (EMI). Accordingly, shielding techniques must be employed to prevent spurious EMI signals, sometimes generated by the control system itself, from causing disruptions in flight control operations.

A Fly-By-Light (FBL) concept proposes a flight vehicle in which the performance of all-sensing and flight control actuation is performed with a DC power distribution system and an optical network to carry all-sensing and control information to and from a centrally located Vehicle Management System (VMS) computer. Such a system would not only be immune to EMI, but would not generate significant EMI itself. In addition, beyond the EMI benefits, substantial weight, volume and cost savings, and enhanced reliability and safety could be realized.

The major technological hurdles in implementation of a FBL system are concentrated at the terminal points of the optical system. The outgoing information carrying optical signal needs to control a function, but most of the control functions involve substantial electrical power, be it the control of a motor, a valve or the control and conditioning of the power itself to, or in electronic systems such as radar or weapons systems. These functions are conventionally performed with power semiconductors that operation in tens of kW power levels. The mere triggering of these devices, however, requires hundreds of Watts.

The general concept of optical isolation is well known, but present optical communication systems transmit power at milli-watts levels. Thus, the transition from the optical world to the electrical world is fundamentally mismatched and is performed in circuitous fashion resulting in expensive and inherently sensitive hardware, namely, optical control of semiconductors is conventional performed only indirectly through an optical to electrical interface which then controls the power semiconductor. Thus, conventional optical communication systems still require low power sensitive components to be present in the harsh environment in order to convert the weak optical signal into an electrical signal strong enough to trigger the power semiconductors. Accordingly, it is an object of the invention to provide a system for optical isolation that includes direct optical control of electrical power semiconductors.

SUMMARY OF THE INVENTION

A system for direct optical control of electronic power semiconductors includes an optical triggering circuit at a first location, wherein said optical triggering circuit generates an optical trigger signal, a power circuit located at a second location remote from the first location, wherein said power circuit includes a photoconductor that is responsive to the optical trigger signal generated by the optical triggering circuit, and an optical cable coupling the optical triggering circuit to the power circuit. In operation, the power circuit is directly driven by the transmission of the optical trigger signal from the optical triggering circuit to the power circuit via the optical cable.

A control processor is generally coupled to the optical triggering circuit, wherein the optical triggering circuit is responsive to receipt of a command signal from the control processor to generate the optical trigger signal. Similarly, the power circuit is used to drive a load such as a DC motor or other device.

In a preferred embodiment, the power circuit includes at least one leg including a pair of transistors, each transistor including a base coupled in series to a photoconductor, wherein activation of the photoconductor turns on the transistor. A shunt photoconductor is also preferably coupled to the base of each transistor, wherein activation of the shunt photoconductor turns off the transistor.

A conventional photo diode with a modified electrode structure can be utilized for the photoconductor. In a preferred embodiment, the modified electrode structure includes a plurality of strips formed on a surface of the photoconductive diode. The strips can be made to intersect to form a grid pattern if desired. In a further embodiment, a photoconductively controlled channel transistor is employed as the photoconductor.

In a further embodiment, inductive elements or a transformer may be coupled in a shunt configuration between a between a series connected photoconductor and a switching device to optimize the performance of driving the switching device.

According to one embodiment of the invention, the control electronics for a fly-by-light system may be encased in a box that is located an aircraft's core. The core may be hardened against EMI and cooled for optimum operation of key electronic systems. Optical fiber lines may radiate from the box including, double, triple or any number of lines. The optical fiber lines are coupled to actuators within the aircraft system, which are internally controlled by the trigger and power stage circuits responsive to light pulses delivered by the fiber optic lines according to embodiments of the present invention. The actuators may be used to operate the flight surfaces of the aircraft.

According to one embodiment of the invention, the actuators are triggered by pulses of light which trigger simple on-off functions at the actuators. The pulses are generated by lasers which may be situated in the box and stimulated digital commands from the control electronics in the box. Actuation of the trigger circuits and/or the power stage electronics may result in a reduction of EMI sensitivity in the aircraft control system. The intensity of the light pulse implemented according to embodiments of the present invention is determined based on the application and the size of the power transistors or other elements that are being actuated by the pulses.

Other modifications, variations and advantages will become apparent to those of ordinary skill in the art from the following detailed description of the preferred embodiments of the invention and the accompanying drawings.

BRIEF DESCRIPTION OF THE DRAWINGS

The invention will now be described with reference to certain preferred embodiments thereof and the accompanying drawings, wherein.

DETAILED DESCRIPTION OF THE PREFERRED EMBODIMENTS

Figure 1:
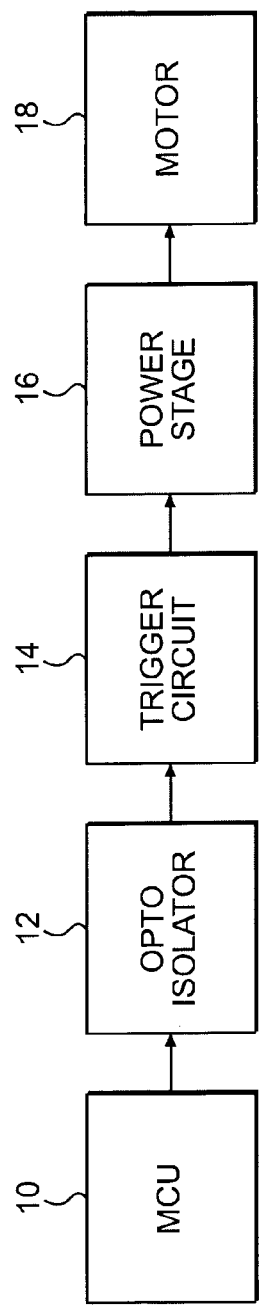
FIG. 1 is a schematic block diagram of a conventional motor control architecture.

A typical flight control motor circuit block diagram is illustrated in FIG. 1. A Motor Control Unit (MCU) 10 establishes the servo loop closure and drive logic for motor current commutation motor current commutation and full four-quadrant control. The Motor Control Unit (MCU) 10 is coupled by a conventional opto-isolator 12 to a trigger circuit 14. The trigger circuit 14 is in turn coupled to a power stage drive circuit 16 used to drive a DC motor 18. In operation, the MCU 10 transmits an electrical command signal to the opto-isolator 12, which converts the electrical command signal into a low power optical signal that is supplied to the trigger circuit 14. The trigger circuit 14 converts the low power optical signal received from the opto-isolator 12 into an electrical signal which then triggers the power stage drive circuit 16 to control the operation of the motor 18. In this architecture, the use of the opto-isolater 12 protects the MCU 10 from the high voltage associated with the trigger circuit 14 and power stage drive circuit 16.

Figure 2:
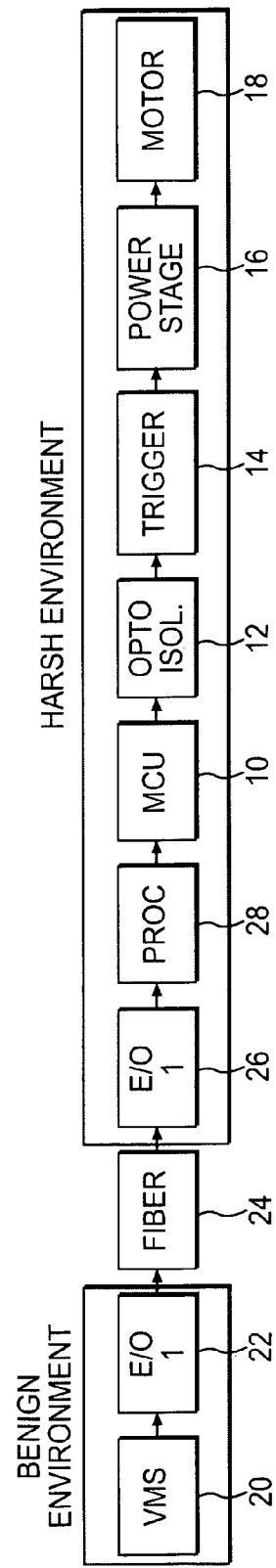
FIG. 2 is a schematic block diagram of the conventional motor control architecture illustrated in FIG. 1 incorporated in a FBL architecture.

FIG. 2 illustrates the implementation of the conventional motor control architecture in a FBL architecture. A VMS 20 computer generates position commands for flight control actuators based on various inputs (pilot, navigation, etc.) and sensor information. The position commands are fed to the MCU 10 via an optical data bus that includes an electrical/optical (E/O) interface transmitter 22, a fiber optic cable 24 and an E/O interface receiver 26. The E/O interface receiver 26 is coupled to processing circuitry 28 that converts the signal received from the E/O interface receiver 26 into a digital position command for the MCU 10. From this point on, the control flow mimics that shown in FIG. 1 with the opto-isolator 12, trigger circuit 14 and power stage 16 provided before the motor 18. In the illustrated architecture, the VMA 20 and E/O interface transmitter 22 remain in a relatively benign environment (for example the cockpit of the aircraft), however the processing circuitry 28, MCU 10 and trigger circuit 14 must be provided in a harsh environment (for example in the wing structure where a flight control motor is located) that includes the power stage 16 and motor 18 and therefore remain susceptible to EMI. In this architecture, the low power signal generated by the E/O interface transmitter 22 is insufficient to effective direct drive of the power stage 16.

Figure 3:
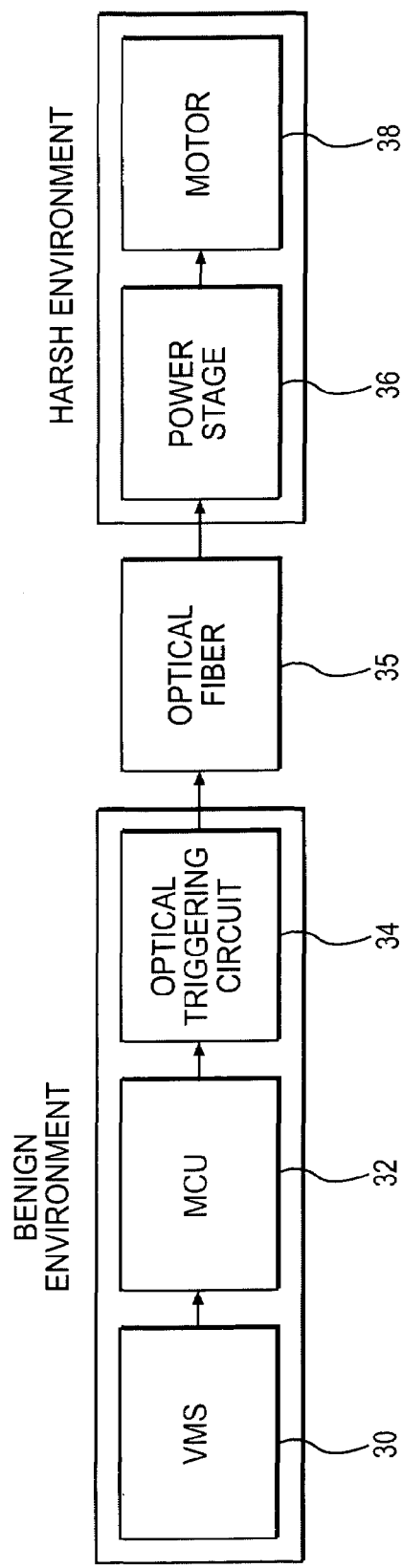
FIG. 3 is a FBL architecture in accordance with the present invention.

Referring now to FIG. 3, an isolation architecture in accordance with the present invention is shown in which a VMS 30 is coupled to a local MCU 32 that is coupled to an optical trigger circuit 34, wherein each of these components is located within a relatively benign environment. An optical fiber cable 35 is provided to couple the optical trigger circuit 34 to a power stage drive circuit 36 which is used to control DC motor 38. In this architecture, the only component within the harsh environment are the power stage 36 and the motor 38. The optical trigger circuit 34 operates a trigger power level that is sufficient to directly trigger the power stage 36.

Figures 4, 5:
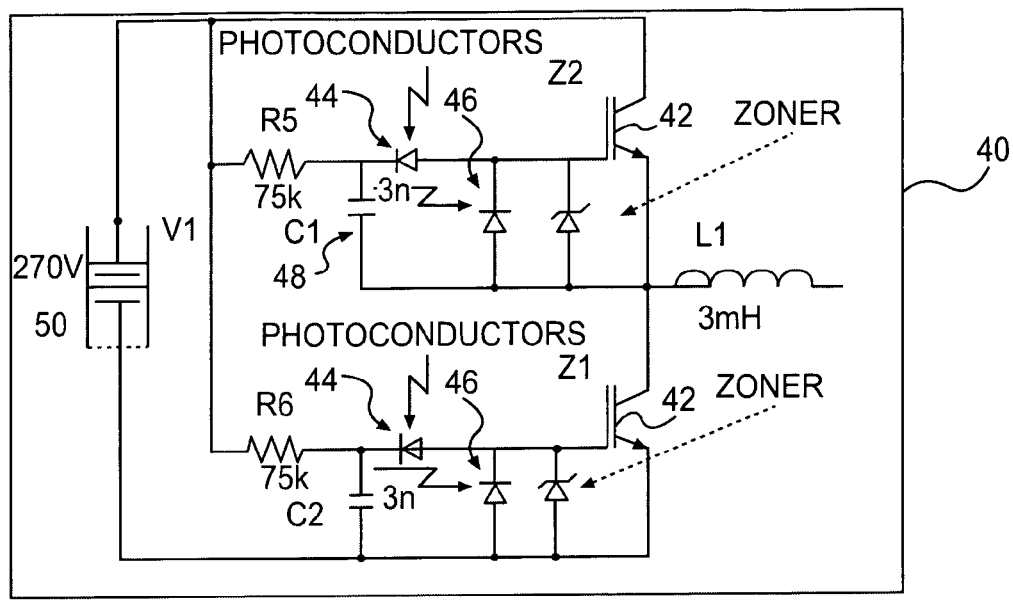
FIG. 4 is a schematic diagram illustrating one leg of a circuit utilized in the power stage circuit of the architecture illustrated in FIG. 3.
FIG. 5 is a table illustrating laser energy requirements for photoconductive structures.

A single leg of a preferred photoconductively controlled power stage circuit 40 to be utilized in the power stage 36 is illustrated in FIG. 4. While only a single leg is shown for purposes of simplification, it will be understood that the illustrated architecture can be readily incorporated into a multi-leg H-bridge motor circuit or equivalent drive circuit. As shown in FIG. 4, IGBT's 42 have their gates coupled in series to high power photoconductors 44 which, when directly activated by a light signal, charge the gates to 15V in order to turn on the IGBT's 42, and shunt photoconductors 46 are provided which, when directly activated by a light signal, drain the gate charge to turn the IGBT's off.

The IGBT gates can be viewed as 50 nF capacitors that are charged to 15V to turn the IGBT on and then discharged to −0v to turn the IGBT off. To turn the device on in 50 ns requires a current of ~CV/t=20 A for ~50 ns. As FIG. 4 shows, the preferred architecture does away with a conventional trigger power supply by charging a capacitor 48 to the full 270V of the DC source 50. This is a charge conserving circuit, which upon activation of the photoconductors 44 settles to the 15V level required by the IGBT's to turn on. The photoconductors are back-biased Silicon junctions. The charge needed to affect activation can be as low as a few nano Joules (nJ) with a Thyristor configured photoconductor and around a μJ with a back-biased diode (single junction) photoconductor. Parameter values for the two photoconductor variants are given in the table illustrated in FIG. 5.

From FIG. 5, in can be seen that the laser energy required is between nJ and a μJ, depending on the type (on vs. off) and whether a thyristor or diode configuration photoconductor is utilized. The thyristor configuration is more economical because it latches on, and turns off only when the current stops flowing. With the load being the gate capacitance the current naturally stops as soon as the voltage on both sides equalize giving the SCR ample time to revert to the off position without affecting the gate voltage. The diode configuration will limit the charge transfer to that created by the photon absorption and provide great flexibility but at greater cost in light. While each has its advantages, the average power is under a Watt in all cases, with the peak power limited to a maximum of 27 W for the diode on function. A typical pulsed laser diode of the PGA series manufactured by EG&G Canada, is in the 100 W peak range which is ample for the task. Accordingly, these laser diodes and their drivers are suitable for use as the optical triggering circuit 34, which is situated on the VMS side of the optical fiber cable 36, where they will not be subjected to the harsh environment.

Figure 6:
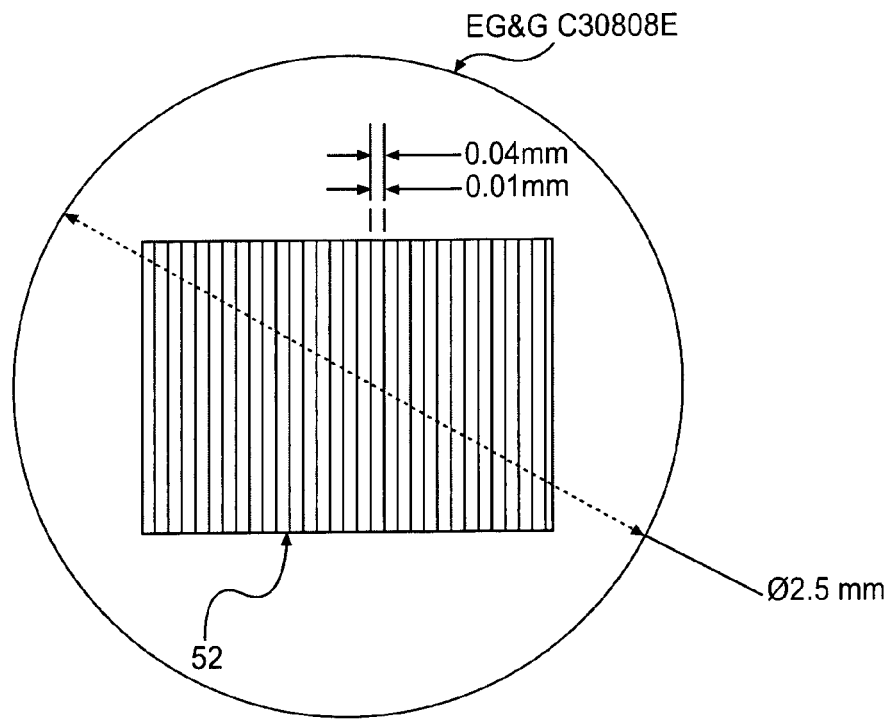
FIG. 6 illustrates a modified electrode structure provided on a surface of a conventional diode.

There are a number of devices that can be implemented for use as the photoconductors 44, 46. As explained above, it will be necessary for the photoconductors 44, 46 to carry relatively high current densities. It has been found that a conventional diode can be modified to achieve the operational performance required of the system architecture described above, namely, a C30808E diode manufactured by EG&G Canada can be modified to carry 20 to 100 A for about 50 ns, in response to flooding the modified device with light from a 50 W PGA type laser diode for about 50 ns, by the application of a modified electrode structure to the conventional diode. As shown in FIG. 6, the modified electrode structure 52 includes a plurality of gold electrode strips provided on the surface of the diode, with each strip having a width of about 10 μm and a thickness of between 0.25–1.0 μm. The strips are separated by gaps have a width of about 40 μm. The addition of the electrode strips allows for increased current densities with only a small voltage drop. The modified electrode structure is not limited to strips, but may also include a grid pattern of intersecting strips.

Figure 7:
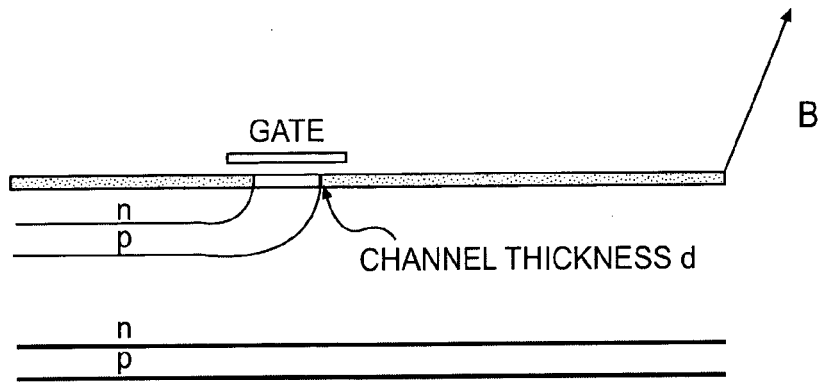
FIG. 7 illustrates a conventional MOS structure.

An alternative to modification of a conventional low current density diode as described above is the use of a photoconductively controlled channel transistor (PCCT). A power semiconductor can be turned off either by stopping the injection through shorting as in an MCT or diversion as in a GTO or through the control of the base current as in a transistor. The MCT uses a MOS structure to short the injecting junction and the IGBT uses a MOS structure to control the base current in a transistor in the Darlington configuration. A fundamental distinction is the amount of current the MOS needs lo carry. In the MCT, the MOS carries the full current for the turnoff duration. In the IGBT, the MOS carries a fraction of the current for the full on duration. The current capability of the MOS device is substantially lower than that of a bipolar device, which results in a substantial allocation of device real-estate to the MOS control region, The limitation of a MOS channel to carry current results from the fundamental limit of the gate oxide to hold voltage and limits the product of the channel thickness (d) and its carrier concentration (n) to 1μ at $10^{16}$, which in turn limits the current to 0.4 A/cm even at drift velocities as high as $10^6$ cm/s (See FIG. 7). The later is a material limit which peaks at a carrier concentration of 1016 with a channel depth of 1μ.

Figure 8:
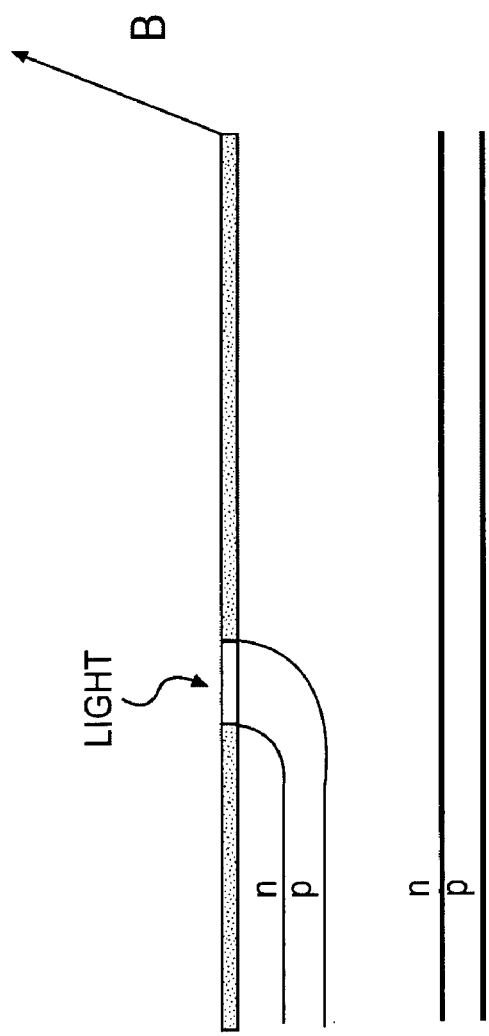
FIG. 8 illustrates a photoconductively controlled channel transistor.

A channel created with photons has no such limitation, it can be both deeper and of higher carrier concentration. The same channel created by the absorption of light can have a higher carrier concentration and greater depth resulting in 1 to 2 orders higher n*d product. In turn, it provides a lower drop and greater utilization of real estate. The photoconductively controlled channel transistor (PCCT) 54 illustrated in FIG. 8, for example, allows the light created in the channel to act as a phototransistor, where the light required to maintain the on state is reduced by the Darlington configuration β, and the phototransitor $β_2$. The larger channel and higher carrier concentration allows the channel to carry higher current, which results in higher power capability for a given device real estate. Thus, the device will exhibit higher speed, power and lower on resistance than a conventional IGBT.

Figure 9:
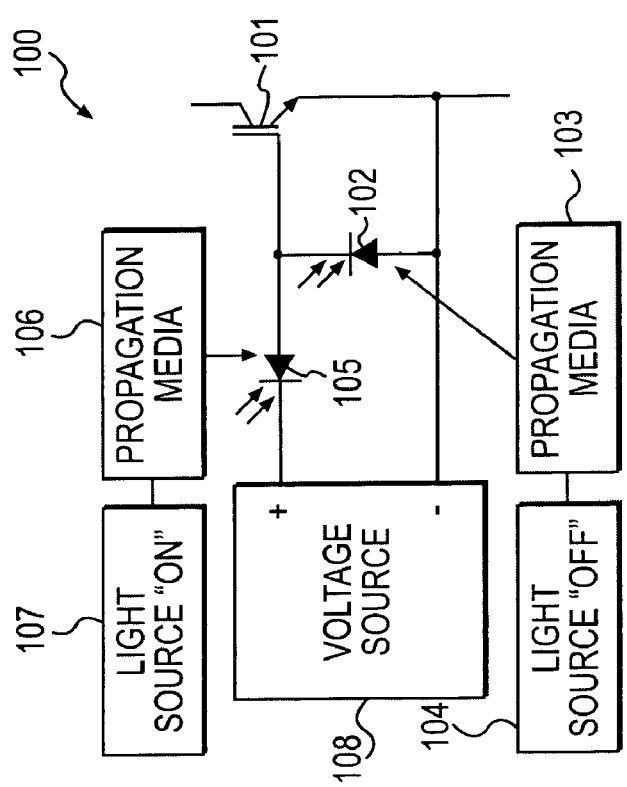
FIG. 9 depicts an optically controlled trigger circuit for use in a remote control application, such as where the trigger circuit triggers a switching device to drive a load device.

FIG. 9 depicts an optically controlled trigger circuit for use in a remote control application, such as where the trigger circuit triggers a switching device to drive a load device. Referring to FIG. 9, optically controlled photoconductors, in particular description, photodiodes 102 and 105 are used to control states of a switching device 101. The switching device 101 may be any switching device and, depending on the application and size of the load, any power semiconductor, including a thyristor, a GTO or an IGBT. With respect to the photoconductors, photodiodes are used as an illustrative example. However, it will be understood that the photoconductor may be any photoconductor, including photodiodes, phototransistors, photothyristors or bulk devices having photoelectric properties that become photoconductive in response to a pulse of light, but that do not require continued application of the light to continue to be photoconductive for the transfer of a given amount of charge or carriers. The photodiode 102 is series connected between the voltage source 108 and the gate or control terminal of the switching device 101. The photodiode 105 is shunt connected between the gate or control terminal for the switching device and the negative or reference terminal of the voltage source 108. Each is controlled by a light source, such as a laser, through a propagation medium, such as an optical fiber. In operation, the trigger circuit operates as follows.

In the absence of light, both photodiodes 102 and 105 exhibit high resistance and the state of the switching device 101 is determined by the voltage to which input capacitance, gate capacitance in particular case, has been charged initially. This value biases the switching device off, and may be close to zero or the reference potential of the voltage source. The source 107 produces a pulse of light to turn ON the switching device, which is directed by transmission media 106, such as an optical fiber, to the photodiode 105. Light illumination of the photodiode 105 produces free electron-hole pairs inside its structure. The photodiode resistance as a result drops in magnitude to a value sufficient to turn on the switching device. The capacitance of the switching device and the switching speed required may be used to determine the ON resistance. For high performance power switching applications, the resistance may be low and in some instances less than one Ohm. In the ON state, the voltage source 108 is connected by the photodiode 105 to the gate of the switching device 101 and charges its input capacitance up to the voltage corresponding to state "ON" of the switching device 101. As the voltage crosses the threshold level, the switching device 101 begins to conduct current between output and reference electrodes thus powering the load to which it is connected. The switching device holds this state while its input capacitance retains charge above a threshold value.

In order to turn OFF the switching device 101 the light source 104 produces a pulse of light, which is directed by the transmission media 103 to the photodiode 102. Under light illumination, the photodiode resistance drops very quickly, with the value set to achieve a performance objective and being set to a low value, including values under one Ohm for high performance, power switching applications. Once the photodiode is turned on, it discharges the capacitance of the gate or control terminal of the switching device to the reference level of the voltage source. When the switching device 101 is shorted to the reference potential by the photodiode 105, the capacitance of its gate or control terminal discharges quickly to zero voltage. When the input voltage crosses threshold level switching device 101, the switching device 101 changes its state from conductive to nonconductive. This turns off the switching device and thus stops the flow of current between the switching device and the load.

Because the lifetime of the electrons produced in the photodiodes by light illumination is longer than switching times of the modern switching devices (microseconds vs. hundreds of nanoseconds) light pulse duration may be as short as it is efficient to generate. Amount of light is corresponded to the value of charge needed to deliver to or to take from the gate of the switching device.

Figure 10:
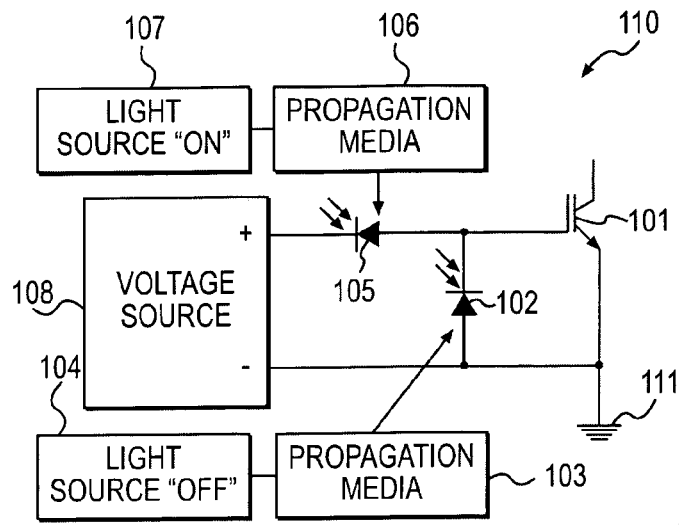
FIG. 10 depicts a trigger circuit configuration according to another embodiment of the present invention which is the same as FIG. 9, except that the reference electrode of the switching device 101 is connected to the ground potential.

FIG. 10 depicts a trigger circuit configuration according to another embodiment of the present invention which is the same as FIG. 9, except that the reference electrode 105 of the switching device 101 is connected to the ground potential.

Figure 11:
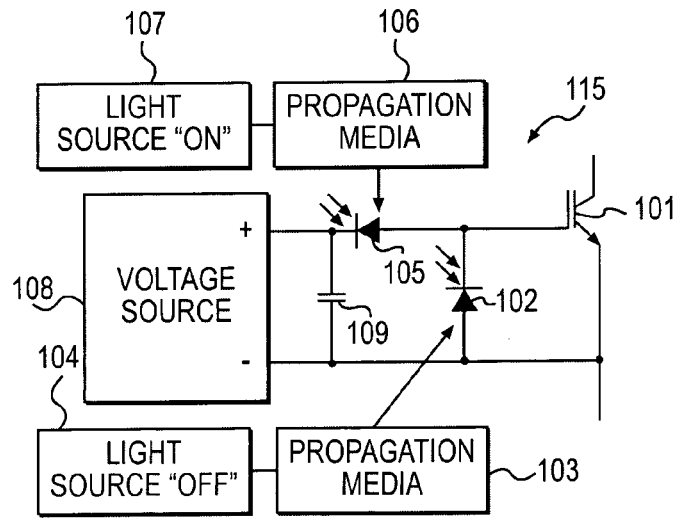
FIG. 11 depicts a trigger circuit configuration according to another embodiment of the present invention.

FIG. 11 depicts a trigger circuit configuration according to another embodiment of the present invention which is the same as FIG. 9, except that a capacitor 109 is connected between output terminals of the voltage source 108.

Figure 12A:
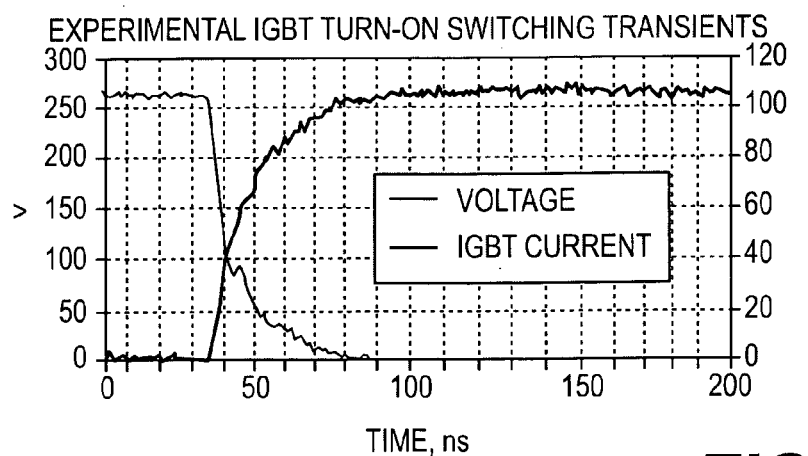
FIGS. 12A and 12B depict operating characteristics for an illustrative trigger circuit driving a switching device.
Figure 12B:
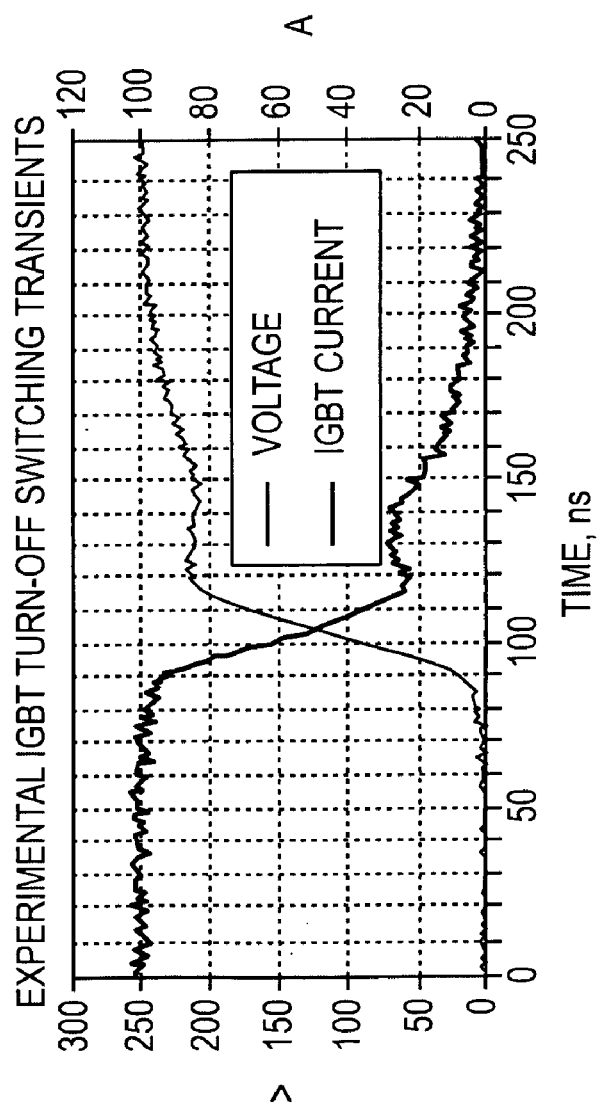

FIG. 12A depicts operating characteristics for an illustrative trigger circuit driving a switching device such as a power IGBT available from International Rectifier. This illustration shows that the trigger circuit according to FIG. 9 is capable of switching current from zero to 100 A at 260V supply voltage in about 40 ns. Switching OFF is shown in FIG. 12B. The ratio of the switching IGBT current to the peak IGBT input capacitance current is in the range of 15 to 20 which tends to provide low EMI sensitivity. Laser diodes were used as sources of light. Fiber optic lines were used as the transmission media.

During the OFF state of the switching device 101 shown in FIG. 9, small leakage of the non-illuminated photoconductor 105 occurs and provides an unwanted charging of the switching device's input capacitance. Under some conditions, it is possible that this unwanted charge may change the state of the switching device 101 if such condition lasts long enough and may cause damage to the switching device or another component.

In particular, when pulses shorter than the lifetime of the carriers in the photodiode 105 are produced by the switching device 101, an additional amount of carriers may be created in the switching-OFF photodiode 102 to neutralize carriers stored in switching-ON photodiode 105 along with carriers stored in the input capacitance of device 101 at the switching-OFF moment. The residual carriers in the photoconducting diode 105 and stored in the capacitance of the switching device require additional light power and slow down switching OFF.

Another embodiment of the invention may be used to reduce or eliminate leakage resistance charging by introducing DC shunting. Such an approach may provide more reliable switching OFF by facilitating of quick extraction of the carriers left in the switching-ON photodiode 105. Moreover, it may provide independent grounding of the voltage source 108 by providing DC isolation of the voltage source 108 from the switching device 101.

Figure 13:
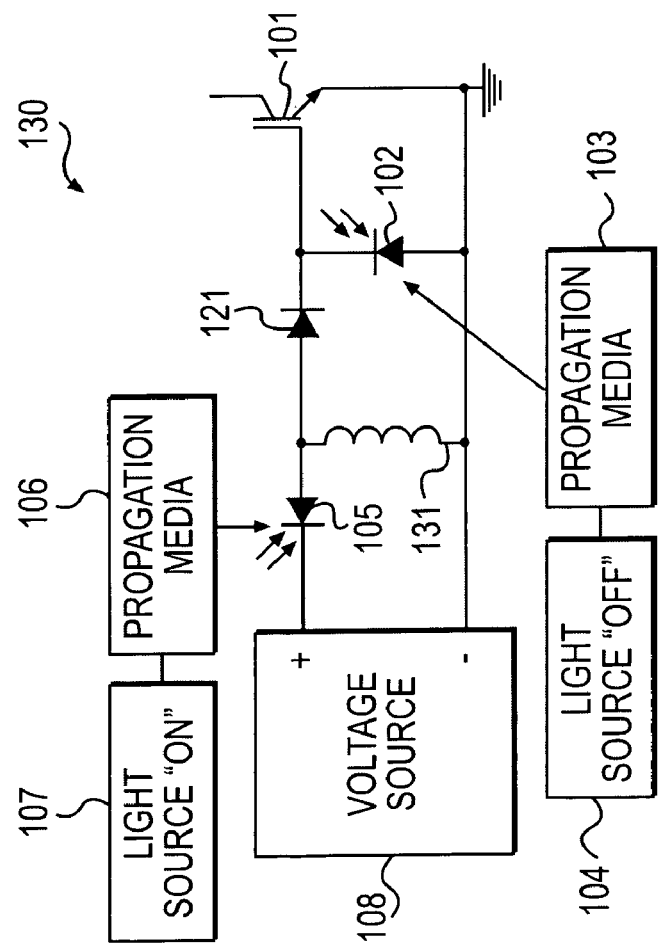
FIG. 13 shows a trigger circuit that includes a shunt inductor and a series connected diode according to an embodiment of the present invention.

FIG. 13 shows a trigger circuit that includes a shunt inductor and a series connected diode according to an embodiment of the present invention. Referring to FIG. 13, the trigger circuit is configured according to FIG. 10. However, the trigger circuit 130 further includes a shunt connected inductor 131 and a series connected diode 121 that is forward biased between the photodiode 105 and the gate of the switching device 101.

As with FIG. 9, in the absence of light both photodiodes 102 and 105 exhibit very high resistance and the state of the switching device 101 is determined by the voltage to which its input capacitance has been charged initially, which may be close to the ground potential. During operation, the source 107 produces a pulse of light, which is directed by propagation media 106 to the photodiode 105. Light illumination of the photodiode 105 produces free electron-hole pairs inside its structure which turns the photodiode 105 ON by dropping its resistance in magnitude to values that depend on the performance requirements but may be under one Ohm for high performance applications. In the ON state of photodiode 105, the voltage source 108 becomes coupled through the photodiode 105 to the anode of the diode 121. The applied voltage forward biases the diode 121 and it in turn conveys applied voltage and current to the control electrode of the switching device 101. This voltage charges its input capacitance up to the voltage corresponding to the state "ON" of the switching device 101. As the input capacitance voltage crosses the threshold level, the switching device 101 begins to conduct current between output and reference electrodes. The inductance value of the inductor 121 may be chosen to have a high enough value to provide low inductor current the during period of charging (typically a hundred nanoseconds).

During the transient period of charging, the derivative of the current in the inductor 131 changes its sign and therefore the inductor voltage as well. Negative voltage swing back biases the diode 121 and causes the diode 121 to stop charging the input capacitance of the switching device 101. The switching device 101 can then hold this state and exchange current with the load being driven, while its input capacitance holds its charge above a threshold level. The negative voltage swing also increases the reverse bias applied to the photoconductor 105 to an amount that may be two times of the voltage of the source 108. In this state, current extracting carriers left in the photoconductor 105 are extracted at a higher rate as compared to the FIG. 10 implementation.

In order to turn OFF the switching device 101, the light source 104 produces a pulse of light, which is directed by the propagation media 103 to the photodiode 102. Under light illumination, the photodiode resistance drops very quickly to values appropriate to the level of performance which may be any value and may be under one Ohm for a high performance system. The input capacitance of the switching device is shorted to ground by the photodiode 102 and thus the capacitance is quickly discharged. When the input voltage or other parameter of the switching device crosses a threshold level, the switching device 101 changes its state from conductive to nonconductive and stops exchanging current with the load that it is driving. The inductor 131 does not effect switching OFF because it is isolated from the switching device by the diode 121.

The lifetime of electrons produced in the photodiodes by light illumination is longer than switching times of the modern switching devices (microseconds vs hundreds of nanoseconds). Thus, the light pulse duration may be as short as it is efficient to generate, that is in a range of the switching time desired, such as from a nanosecond to tens of nanoseconds or higher depending on the performance of the application.

Figure 14:
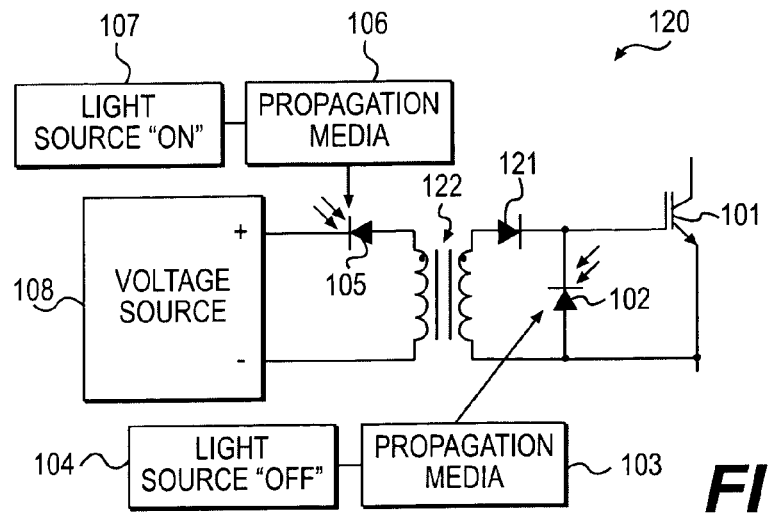
FIG. 14 depicts a triggering circuit according to an other embodiment of the present invention that includes a shunt transformer and a series diode.

FIG. 14 depicts a triggering circuit according to an other embodiment of the present invention that includes a shunt transformer and a series diode. Referring to FIG. 14, the trigger circuit is configured according to FIG. 10. However, the trigger circuit further includes a series connected diode 121 that is forward biased between the photodiode 105 and the gate of the switching device 101 and a shunt connected inductor 131 connected between the anode of the diode and the drain or emitter of the switching device 101.

This circuit operates as follows, in the absence of light both photodiodes 102 and 105 exhibit high resistance and the state of the switching device 101 is determined by the voltage to which its input capacitance has been charged initially. The source 107 produces a pulse of light, which is directed by propagation media 106 to the photodiode 105. Light illumination of the photodiode 105 produces free electron-hole pairs inside its structure. The photodiode resistance drops in magnitude to values under one Ohm for high performance applications. Under these conditions, the voltage source 108 is coupled through the photodiode 105 to the primary winding of the transformer 122, which may have a coupling coefficient close to 1 for efficient coupling. The voltage induced in the secondary winding of the transformer 122 is then applied to the anode of the diode 121. Applied voltage forward biases diode 121 and it becomes conductive, delivering applied voltage to the control electrode of the switching device 101. This voltage charges the input capacitance of the switching device 101 up to the voltage corresponding to the state ON state of the switching device. As the voltage on the control electrode of the switching device crosses the threshold level, the switching device 101 begins to conduct current between output and reference electrodes. The shunting inductance value of the primary winding of the transformer 122 may be high enough to be enough to provide low inductor current during period of charging (typically hundred nanoseconds) allowing to achieve very small leakage inductance. During the transient period, the derivative of the current in the primary winding of the transformer 122 changes its sign and voltage as well. Negative voltage swing on the secondary winding then back biases the diode 121 and stops charging the input capacitance of the switching device 101. Switching device 101 then can hold this state until the charge on the input capacitance is depleted below a threshold value.

The negative voltage swing also increases reverse biasing applied to the photoconductor 105 to an amount that is about two times of the voltage of the source 108 shown in FIG. 9. Under this condition, the current extracting carriers left in the photoconductor 105 take less time to extract.

In order to turn OFF the switching device 101, the light source 104 produces a pulse of light, which is directed by propagation media 103 to the photodiode 102. Under light illumination, the photodiode resistance drops quickly. The input capacitance of the switching device 101 shortened by low resistance discharges very quickly to zero voltage. When the voltage on the capacitance crosses a threshold level, the switching device 101 changes its state from conductive to nonconductive. The transformer 122 does not effect switching OFF because is isolated by the diode 121.

Figure 15:
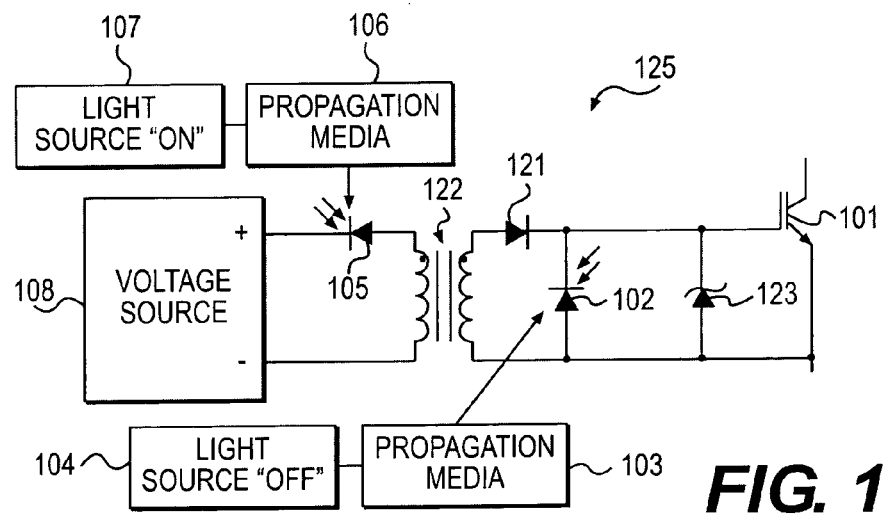
FIG. 15 depicts a trigger circuit according to an alternative embodiment of the present invention which further includes a zener diode shunt connected to the switching device 101.

FIG. 15 depicts a trigger circuit according to an alternative embodiment of the present invention which further includes a zener diode shunt connected to the switching device 101. This circuit operates in the same manner as the circuit shown in FIG. 14, except that the voltage applied to the control electrode of the switching device cannot exceed a certain level defined by Zener diode. This limits switching losses in the semiconductor.

Figure 16:
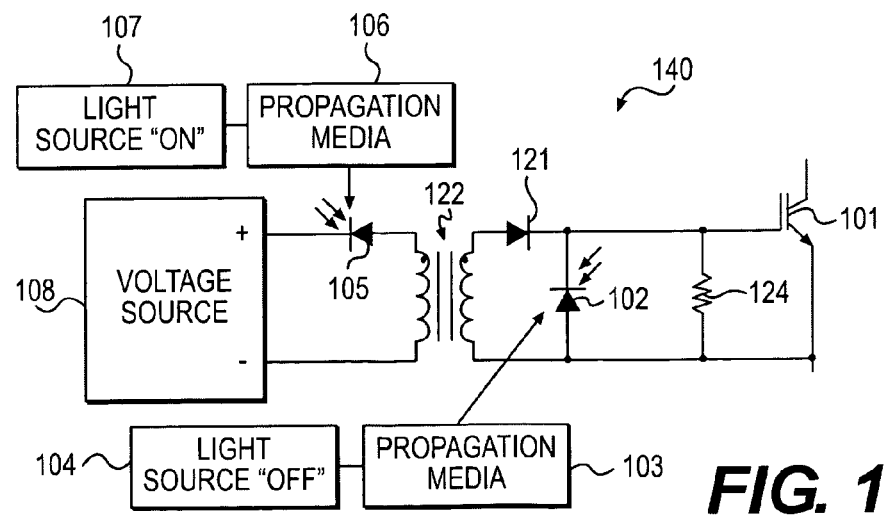
FIG. 16 depicts a trigger circuit according to an alternative embodiment of the present invention which further includes a resistor shunt connected to the switching device 101.

FIG. 16 depicts a trigger circuit according to an alternative embodiment of the present invention which further includes a resistor shunt connected to the switching device 101. This circuit operates in the same manner as the circuit shown in FIG. 15, except that the resistor fixes at the reference potential the initial voltage applied to the control electrode of the switching device 101. This resistor may be used together with a Zener diode.

Figure 17A:
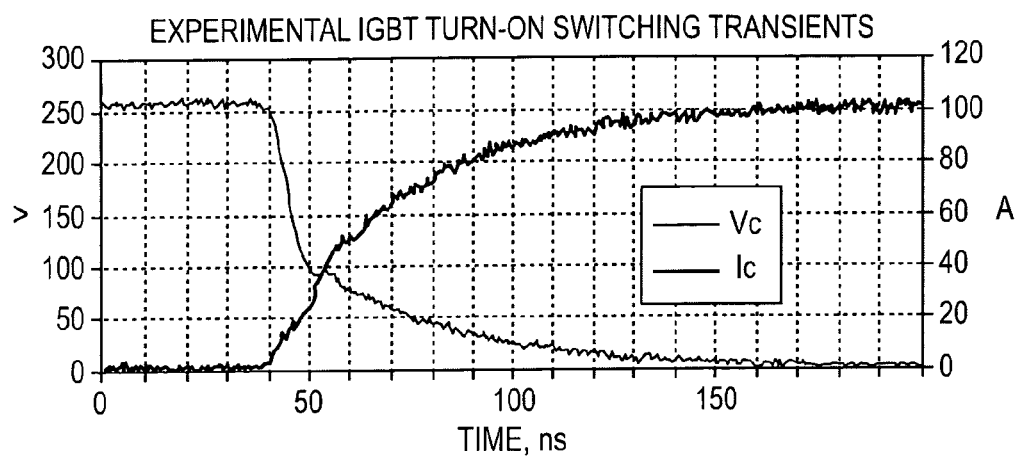
FIGS. 17A and 17B depict operating characteristics for an illustrative trigger circuit driving a switching device.
Figure 17B:
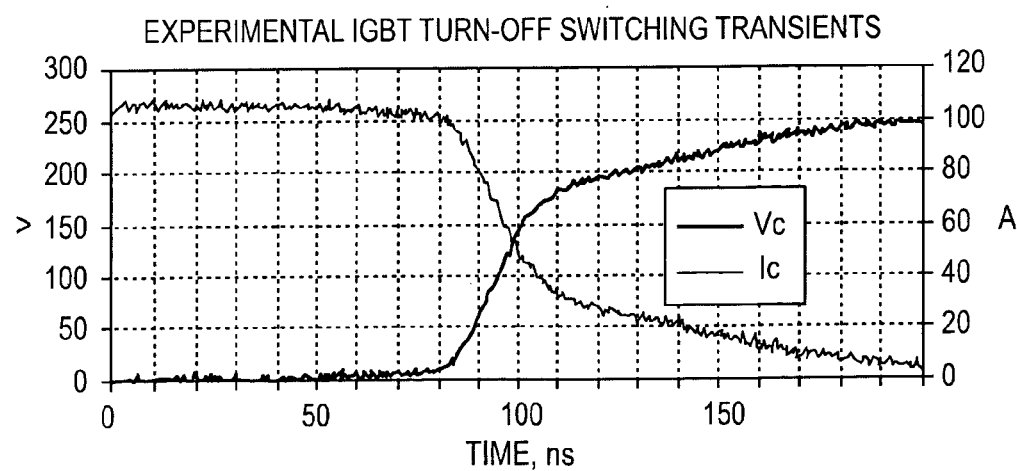

FIG. 17A depicts operating characteristics for an illustrative trigger circuit driving a switching device such as a power IGBT available from International Rectifier. This illustration shows that the trigger circuit according to FIG. 15 is capable of switching current from zero to 100 A at 260 V supply voltage in about 60 ns. Switching OFF is shown in FIG. 17B. Laser diodes were used as sources of light. Fiber optic lines were used as the transmission media.

The invention has been described with reference to certain preferred embodiments thereof. It will be understood, however, that modifications and variations are possible within the scope of the appended claims. For example, the preferred embodiment was illustrated with reference to flight control systems. The invention, however, is not limited to this application, but instead, can be utilized in any situation in which sensitive control circuitry must be isolated from less sensitive power circuitry located in a harsh environment. In particular, the configurations of circuits shown above are illustrative nature. It will be understood that additional circuit elements may be inserted into the circuits between the elements depicted above. It will be further understood that each of the trigger circuits may be implemented on the same integrated circuit chip with the switching device and that multiple trigger circuits and switching devices may be implemented on one or multiple integrated circuit chips to drive a load, such as a motor, for remote control applications according to embodiments of the present invention.

What is claimed is:

1. An apparatus comprising:
   a switching device having a control terminal for driving a load;
   a triggering circuit coupled to the switching device including input terminals for a voltage source and at least two photoconductors, one being coupled in series with the control terminal of the switching device and one being shunt connected with the switching device; and
   a forward biased diode coupled in series between the series connected photoconductor and the control terminal of the switching device,
   wherein the photoconductors of the triggering circuit each receives an optical pulse, generated by a control unit remote from the triggering circuit, for turning on the photoconductors to apply voltage from the voltage source to the control terminal of the switching device to turn the switching device on and to remove voltage from the control terminal of the switching device to turn the switching device off.

2. The apparatus according to claim 1, wherein the photoconductors receive the optical pulses successively.

3. The apparatus according to claim 1, further comprising:
   a shunt capacitor coupled across the terminals for the voltage source.

4. The apparatus according to claim 1, further comprising:
   an inductor coupled as a shunt between the series connected photoconductor and diode and a reference terminal for the voltage source.

5. The apparatus according to claim 1, further comprising:
   a transformer coupled as a shunt between the series connected photoconductor and diode and a reference terminal for the voltage source.

6. The apparatus according to claim 1, further comprising:
   a zener diode coupled as a shunt between the control terminal of the switching device and a reference terminal for the voltage source.

7. The apparatus according to claim 1, further comprising:
   a resistor coupled as a shunt between the control terminal of the switching device and a reference terminal for the voltage source.

8. The apparatus according to claim 6, further comprising:
   a resistor coupled as a shunt between the control terminal of the switching device and a reference terminal for the voltage source.

9. The apparatus according to claim 1, wherein the photoconductor comprises a photodiode.

10. The apparatus according to claim 1, wherein the photoconductor comprises a phototransistor.

11. The apparatus according to claim 1, wherein the photoconductor comprises a photothyristor.

* * * * *